(12) United States Patent
Woo et al.

(10) Patent No.: US 7,592,850 B2
(45) Date of Patent: Sep. 22, 2009

(54) LEVEL SHIFTER INCLUDING BOOSTING CIRCUIT

(75) Inventors: Jae-hyuck Woo, Osan-si (KR); Jae-goo Lee, Yongin-si (KR)

(73) Assignee: Samsung Electronics Co, Ltd., Suwon-Si (KR)

( * ) Notice: Subject to any disclaimer, the term of this patent is extended or adjusted under 35 U.S.C. 154(b) by 0 days.

(21) Appl. No.: 11/842,739

(22) Filed: Aug. 21, 2007

(65) Prior Publication Data

US 2008/0048754 A1 Feb. 28, 2008

(30) Foreign Application Priority Data

Aug. 25, 2006 (KR) .................. 10-2006-0081172

(51) Int. Cl.
*H03L 5/00* (2006.01)
(52) U.S. Cl. ..................... 327/333; 326/68; 326/81
(58) Field of Classification Search .......... 327/333; 326/68, 80, 81; 365/189.11
See application file for complete search history.

(56) References Cited

U.S. PATENT DOCUMENTS

| | | | |
|---|---|---|---|
| 6,255,888 B1* | 7/2001 | Satomi | 327/333 |
| 6,677,798 B2 | 1/2004 | Chang et al. | |
| 6,809,554 B2* | 10/2004 | Wada | 326/81 |
| 2006/0197579 A1* | 9/2006 | Kanno et al. | 327/333 |
| 2006/0290404 A1* | 12/2006 | Law | 327/333 |
| 2007/0164805 A1* | 7/2007 | Horibata et al. | 327/333 |
| 2007/0195614 A1* | 8/2007 | Kim et al. | 365/189.11 |

FOREIGN PATENT DOCUMENTS

| | | |
|---|---|---|
| JP | 2004-007831 | 1/2004 |
| JP | 2005-184671 | 7/2005 |

OTHER PUBLICATIONS

English Abstract for Publication No. 2004-007831.
English Abstract for Publication No. 2005-184671.

* cited by examiner

*Primary Examiner*—Long Nguyen
(74) *Attorney, Agent, or Firm*—F. Chau & Associates, LLC

(57) ABSTRACT

A level shifter includes a level shifting circuit shifting a level of a boosted signal input through an input terminal connected to the level shifter and outputting the boosted signal at a new level, and a boosting circuit receiving an input signal, boosting a voltage of the input signal to generate the boosted signal, and providing the boosted signal to the input terminal.

8 Claims, 6 Drawing Sheets

LEVEL SHIFTER INCLUDING BOOSTING CIRCUIT

CROSS-REFERENCE TO RELATED PATENT APPLICATION

This application claims the benefit of Korean Patent Application No. 10-2006-0081172, filed on Aug. 25, 2006, in the Korean Intellectual Property Office, the disclosure of which is herein incorporated by reference in its entirety.

BACKGROUND OF THE INVENTION

1. Field of the Invention

The present invention relates to a semiconductor integrated circuit, and more particularly, to a level shifter which is used in the semiconductor integrated circuit.

2. Description of Related Art

A level shifter is a circuit which is widely used in semiconductor integrated circuits. The level shifter shifts a level of a signal input through an input terminal to a higher level and outputs the signal at the higher level. U.S. Patent Application Publication No. 2005/0195676 A1 discloses an example of such level shifter. The level shifter may be classified as a latch type level shifter as illustrated in FIG. 1 or a non-latch type level shifter as illustrated in FIG. 2.

As semiconductor manufacturing processes are becoming more precise, smaller source voltages are applied to a semiconductor integrated circuit. Accordingly, an external source voltage cannot be applied as is to the semiconductor integrated circuit. The external source voltage needs to be lowered to generate an internal source voltage that can be applied to the semiconductor integrated circuit. In FIGS. 1 and 2, VDD1 denotes an internal source voltage and VDD2 denotes an external source voltage.

Typically, when the semiconductor integrated circuit is in a deep standby mode, that is, when the internal source voltage VDD1 does not need to be applied to the semiconductor integrated circuit, a level of the internal source voltage VDD1 is the same as a level of a ground voltage VSS in order to remove a leakage current while the external source voltage VDD2 is kept constant.

The latch type level shifter of FIG. 1 is used to prevent generation of the leakage current by maintaining data when the semiconductor integrated circuit is in a deep standby mode. The latch type level shifter does not generate a leakage current, however, the latch type level shifter cannot shift a level of an output signal OUT to a sufficiently high level when the applied source voltage VDD1 is low.

The non-latch type level shifter of FIG. 2 can shift a level of an output signal OUT to a sufficiently high level even when the applied source voltage VDD1 is low. However, the non-latch type level shifter cannot prevent generation of the leakage current when the semiconductor integrated circuit is in a deep standby mode, that is, when a level of the source voltage VDD1 is the same as a level of the ground voltage VSS and the source voltage VDD2 is kept constant.

SUMMARY OF THE INVENTION

According to an embodiment of the present invention, a level shifter includes a level shifting circuit shifting a level of a boosted signal input through an input terminal connected to the level shifter and outputting the boosted signal at a new level, and a boosting circuit receiving an input signal, boosting a voltage of the input signal to generate the boosted signal, and providing the boosted signal to the input terminal.

The level shifting circuit may be a latch-type level shifting circuit. The boosting circuit may use a first source voltage as a source voltage and the level shifting circuit uses a second source voltage, which is higher than the first source voltage, as the source voltage.

The level shifting circuit may include a latch circuit, a first MOS transistor having a gate connected to the input terminal, a first end connected to a first output terminal of the latch circuit, and a second end connected to a reference voltage, and a second MOS transistor having a gate connected to a complementary input terminal of the input terminal, a first end connected to a second output terminal of the latch circuit, and a second end connected to the reference voltage, wherein an output signal is output from the second output terminal of the latch circuit.

The boosting circuit may include first through fourth inverters, a delay unit, first and second capacitors, and first through fourth control transistors.

The first inverter reverses the input signal and the second inverter reverses an output signal of the first inverter. The delay unit delays an output signal of the second inverter, the third inverter reverses an output signal of the delay unit, and the fourth inverter reverses an output signal of the third inverter. A first end of the first capacitor is connected to an output terminal of the fourth inverter and a second end of the first capacitor is connected to the input terminal. A first end of the second capacitor is connected to an output terminal of the third inverter and a second end of the second capacitor is connected to a complementary input terminal of the input terminal connected to the level shifting circuit.

The first control transistor has a gate connected to an output terminal of the second inverter, a first end connected to the first source voltage, and a second end connected to the input terminal. The second control transistor has a gate connected to an output terminal of the first inverter, a first end connected to the input terminal of the level shifting circuit, and a second end connected to the reference voltage. The third control transistor has a gate connected to an output terminal of the first inverter, a first end connected to the first source voltage, and a second end connected to the complementary input terminal. The fourth control transistor has a gate connected to an output terminal of the second inverter, a first end connected to the complementary input terminal, and a second end connected to the reference voltage.

According to an embodiment of the present invention, an input voltage boosting level shifter comprises a boosting circuit for receiving an input signal and a first source voltage, boosting the level of the input signal, and outputting a boosted signal, and a latch type level shifting circuit receiving the boosted signal and a second source voltage greater than the first source voltage and shifting a level of the boosted signal to a logic high level when the first source voltage is at a low logic level. An operating current of the latch type level shifting circuit does not exhibit a leakage current when the first source voltage has a voltage of a ground voltage.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
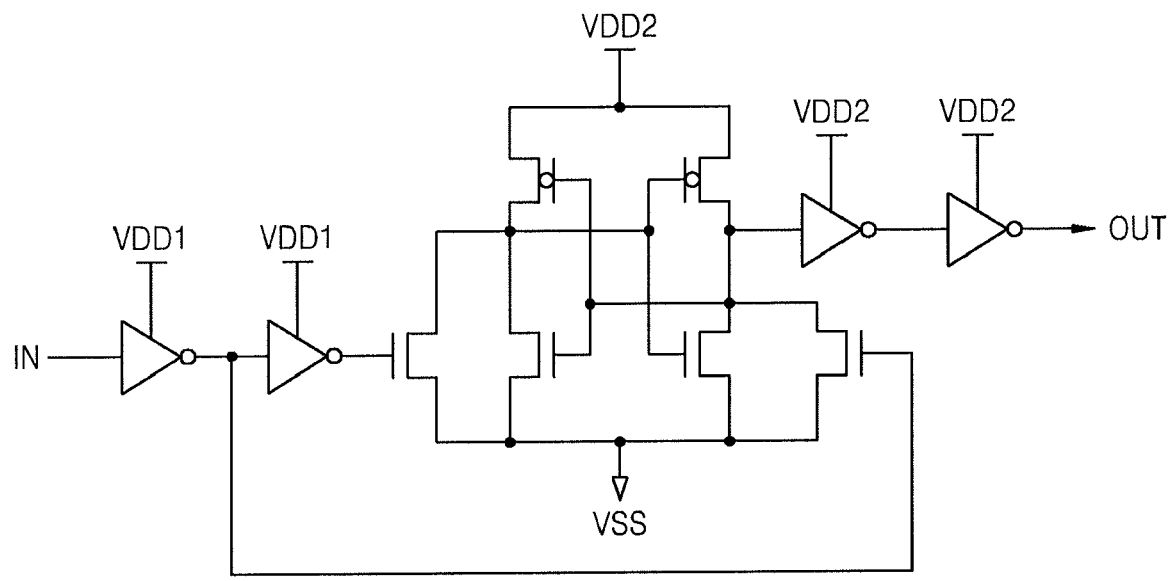
FIG. 1 is a circuit diagram of a latch type level shifter.

The attached drawings illustrate preferred embodiments of the present invention.

Hereinafter, the present invention will be described in detail by explaining preferred embodiments of the invention with reference to the attached drawings. Like in the drawings denote like elements.

Figure 3:
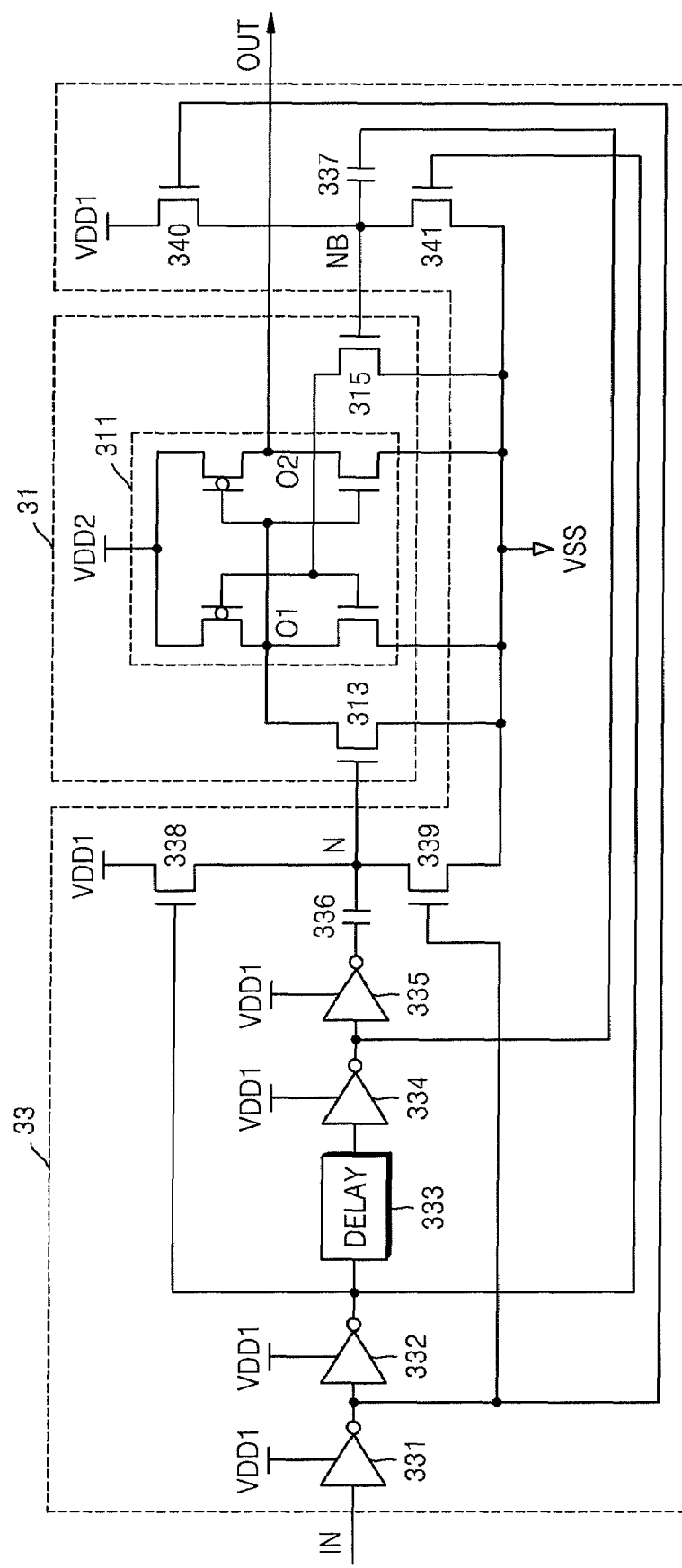
FIG. 3 is a circuit diagram of a level shifter according to an embodiment of the present invention.

FIG. 3 is a circuit diagram of a level shifter according to an embodiment of the present invention.

Referring to FIG. 3, the level shifter has a function to boost a voltage level of an input signal IN. The level shifter includes a level shifting circuit 31 and a boosting circuit 33.

The boosting circuit 33 is includes an input terminal N and complementary input terminal NB, both connected to the level shifting circuit 31. The boosting circuit 33 receives the input signal IN, boosts a voltage of the input signal IN, and provides the boosted signal to the input terminal N and the complementary input terminal NB connected to the level shifting circuit 31. The level shifting circuit 31 shifts a level of a signal input through the input terminal N and the complementary input terminal NB, and outputs an output signal OUT.

The level shifting circuit 31 is a latch-type level shifting circuit. The boosting circuit 33 uses a first source voltage VDD1 as a source voltage and the level shifting circuit 31 uses a second source voltage VDD2, which is higher than the first source voltage VDD1, as the source voltage.

More specifically, the level shifting circuit 31 includes a latch circuit 311, a first NMOS transistor 313 and a second NMOS transistor 315.

The first NMOS transistor 313 has a gate connected to the input terminal N, a drain connected to a first output terminal O1 of the latch circuit 311, and a source connected to a reference voltage, that is, a ground voltage VSS.

The second NMOS transistor 315 has a gate connected to the complementary input terminal NB, a drain connected to a second output terminal O2 of the latch circuit 311, and a source connected to the ground voltage VSS. The output signal OUT is output from the second output terminal O2 of the latch circuit 311.

The boosting circuit 33 includes a first inverter 331, a second inverter 332. a delay unit 333, a third inverter 334, a fourth inverter 335, a first capacitor 336, a second capacitor 337, and first through fourth control transistors 338-341.

The first inverter 331 reverses the input signal IN and the second inverter 332 reverses an output signal of the first inverter 331. The delay unit 333 delays an output signal of the second inverter 332, the third inverter 334 reverses an output signal of the delay unit 333, and the fourth inverter 335 reverses an output signal of the third inverter 334. One end of the first capacitor 336 is connected to an output terminal of the fourth inverter 335 and the other end of the first capacitor 336 is connected to the input terminal N connected to the level shifting circuit 31. One end of the second capacitor 337 is connected to an output terminal of the third inverter 334 and the other end of the second capacitor 337 is connected to the complementary input terminal NB connected to the level shifting circuit 31.

The first through fourth control transistors 338-341 are NMOS transistors. The first control transistor 338 has a gate connected to an output terminal of the second inverter 332, a drain connected to the first source voltage VDD1, and a source connected to the input terminal N connected to the level shifting circuit 31. The second control transistor 339 has a gate connected to an output terminal of the first inverter 331, a drain connected to the input terminal N connected to the level shifting circuit 31, and a source connected to the ground voltage VSS.

The third control transistor 340 has a gate connected to an output terminal of the first inverter 331, a drain connected to the first source voltage VDD1, and a source connected to the complementary input terminal NB connected to the level shifting circuit 31. The fourth control transistor 341 has a gate connected to an output terminal of the second inverter 332, a drain connected to the complementary input terminal NB connected to the level shifting circuit 31, and a source connected to the ground voltage VSS.

In operations of the boosting circuit 33, for example, when a logic level of the input signal IN is high, a logic level of the output signal of the first inverter 331 is low (VSS level) and a logic level of the output signal of the second inverter 332 is high (VDD1 level). A logic level of the output signal of the third inverter 334 is low and a logic level of an output signal of the fourth inverter 335 is high.

Given an input signal IN having a high logic level, the first control transistor 338 is turned on, the second control transistor 339 is turned off, the first control transistor 340 is turned off, and the fourth control transistor 341 is turned on. A level of the input terminal N connected to the level shifting circuit 31 is boosted to 2VDD1−Vth (Vth is a threshold voltage of the first control transistor 338) and a level of the complementary input terminal NB is the same as a level of the ground voltage VSS.

Since the first control transistor 338 in the level shifting circuit 31 is turned on, a level of the output signal OUT can be shifted to a high level even when a level of the source voltage VDD1 is low. Also, since the level shifting circuit 31 is a latch type level shifting circuit, data is maintained and a leakage current is not generated even when a semiconductor integrated circuit is in a deep standby mode wherein a level of a source voltage VDD1 is the same as the level of a ground voltage VSS.

Figure 2:
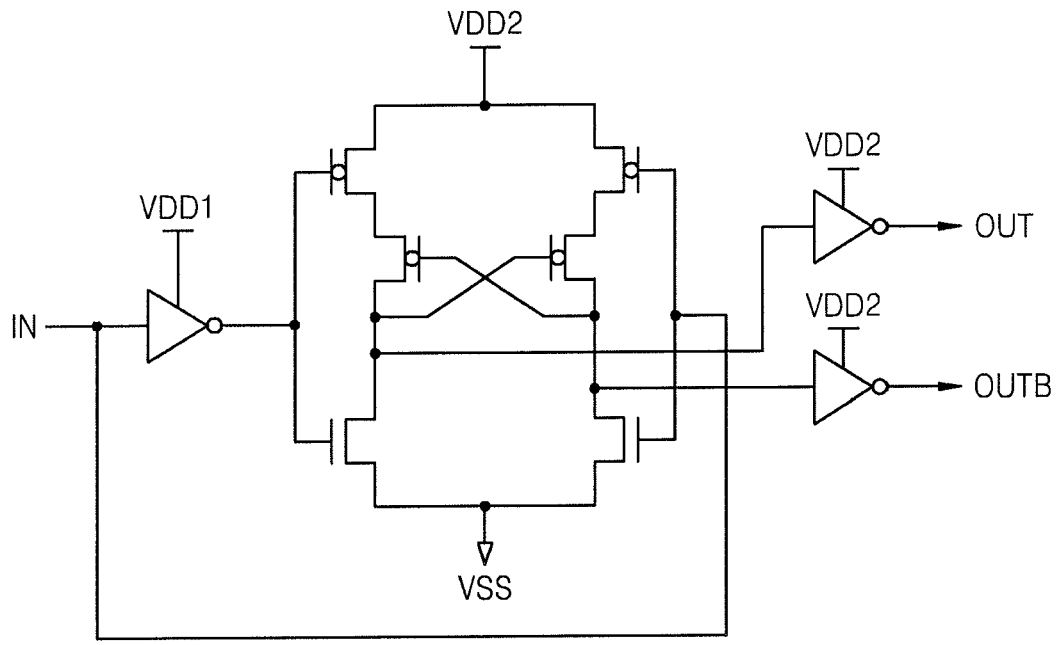
FIG. 2 is a circuit diagram of a non-latch type level shifter.

FIGS. 4A through 5b illustrate simulation results of the latch type level shifter of FIG. 1 and the non-latch type level shifter of FIG. 2. FIGS. 6A-7B illustrate simulation results of the level shifter according to the present invention in FIG. 3.

Figure 4A:
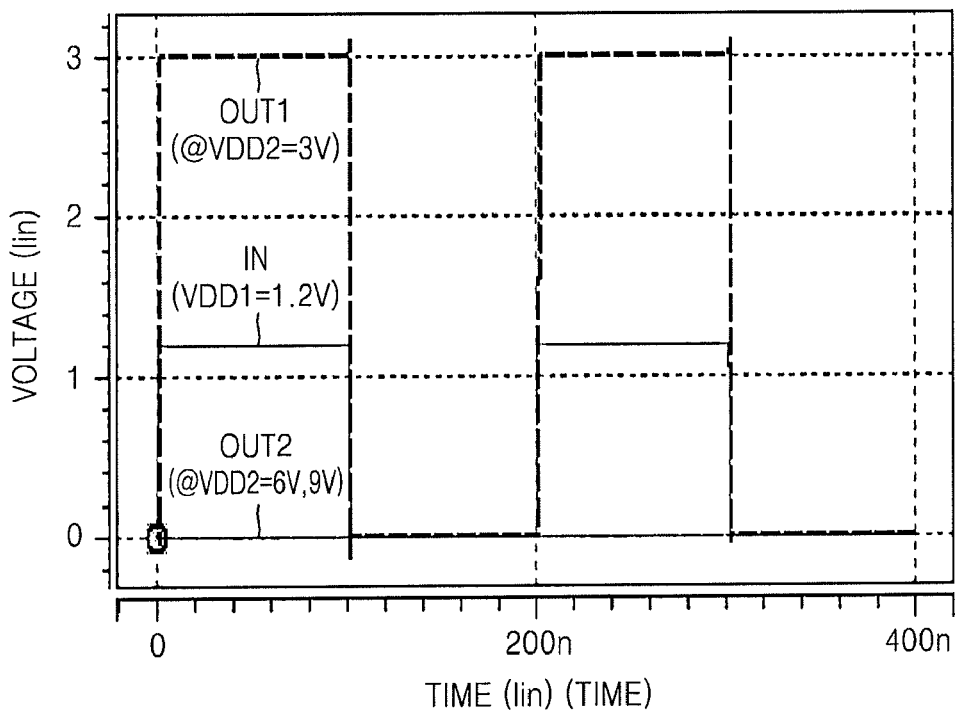
FIG. 4A illustrates a voltage simulation result of the conventional latch type level shifter of FIG. 1.
Figure 4B:
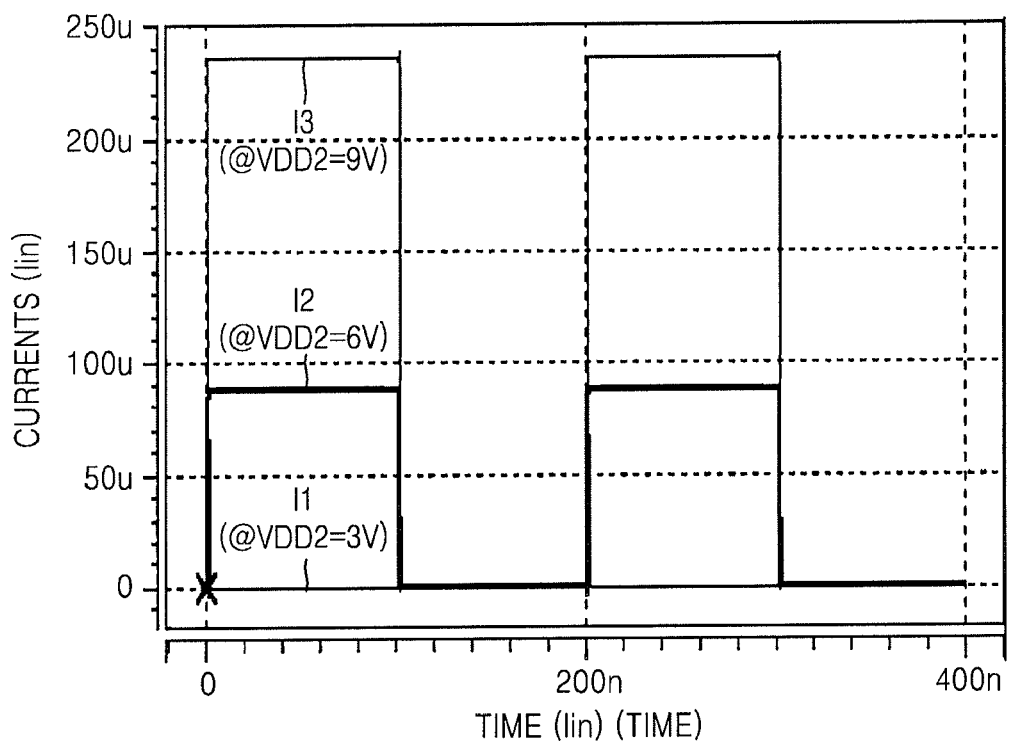
FIG. 4B illustrates a current simulation result of the conventional latch type level shifter of FIG. 1.

FIG. 4A illustrates a voltage simulation result of the latch type level shifter of FIG. 1 and FIG. 4B illustrates a current simulation result of the conventional latch type level shifter of FIG. 1.

In FIG. 4A, IN denotes an input signal; OUT1 denotes an output signal when a source voltage VDD1 is 1.2V and a source voltage VDD2 is 3V; and OUT2 denotes an output signal when the source voltage VDD1 is 1.2V and the source voltage VDD2 is 6V or 9V. In FIG. 4B, I1 denotes an operating current when the source voltage VDD1 is 1.2 and the source voltage VDD2 is 3V; I2 denotes an operating current when the source voltage VDD1 is 1.2 and the source voltage VDD2 is 6V; and I3 denotes an operating current when the source voltage VDD1 is 1.2 and the source voltage VDD2 is 9V.

Figure 5A:
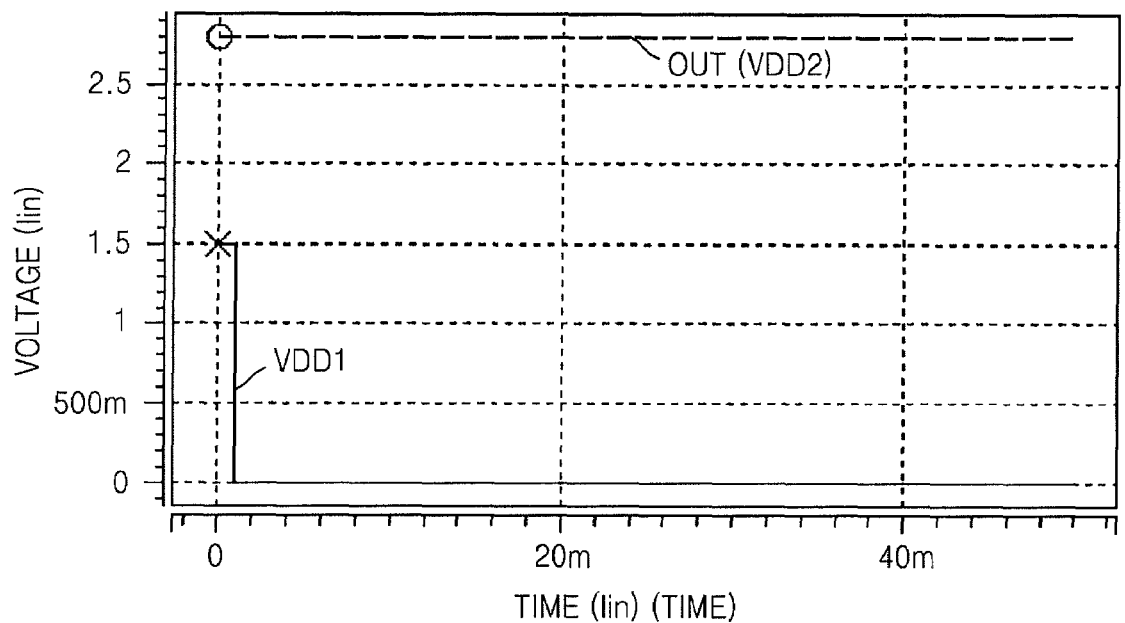
FIG. 5A illustrates levels of a source voltage VDD1 and a source voltage VDD2 of the non-latch type level shifter of FIG. 2 in a deep standby mode.

Referring to FIG. 4B, the latch type level shifter of FIG. 1 has an advantage that a leakage current is not generated. Referring to FIG. 4A, a level of an output signal OUT is shifted to 3V, however, the level is not shifted to 6V or more when the source voltage VDD1 is as low as 1.2V FIG. 5A illustrates levels of a source voltage VDD1 (a ground level VSS) and a source voltage VDD2 of the non-latch type level shifter of FIG. 2 in a deep standby mode. FIG. 58 illustrates a current simulation result of the non-latch type level shifter of FIG. 2 in a deep standby mode.

Figure 5B:
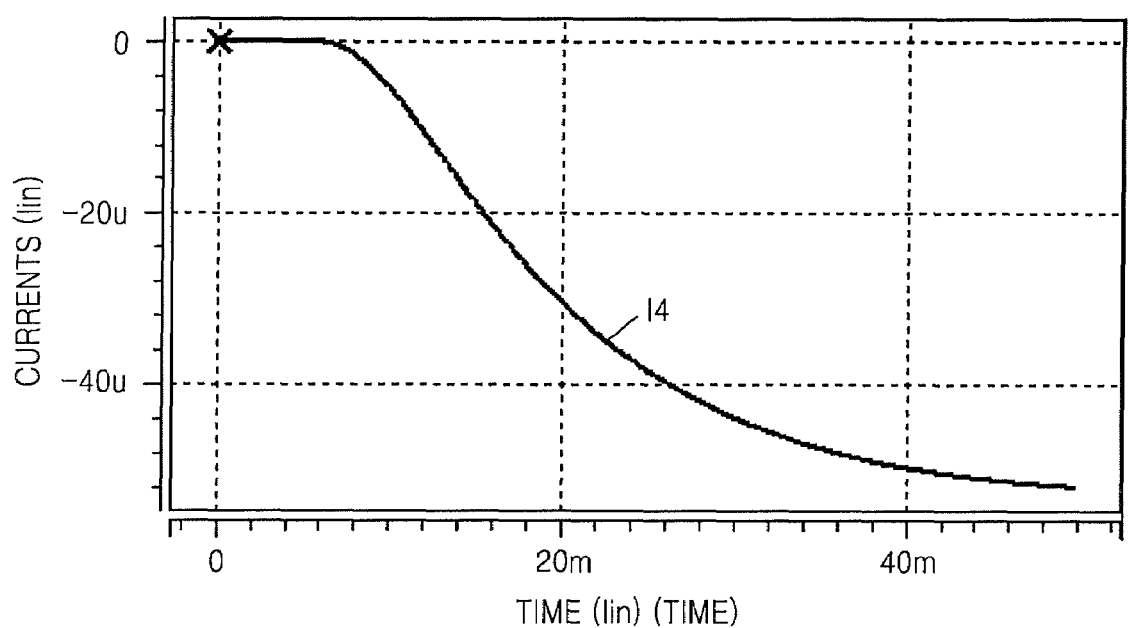
FIG. 5B illustrates a current simulation result of the non-latch type level shifter of FIG. 2 in a deep standby mode.

Referring to FIG. 5B, in the non-latch type level shifter of FIG. 2, a leakage current I4 is generated in a deep standby mode wherein a level of a source voltage VDD1 is the same with a level of a ground voltage VSS.

Figure 6A:
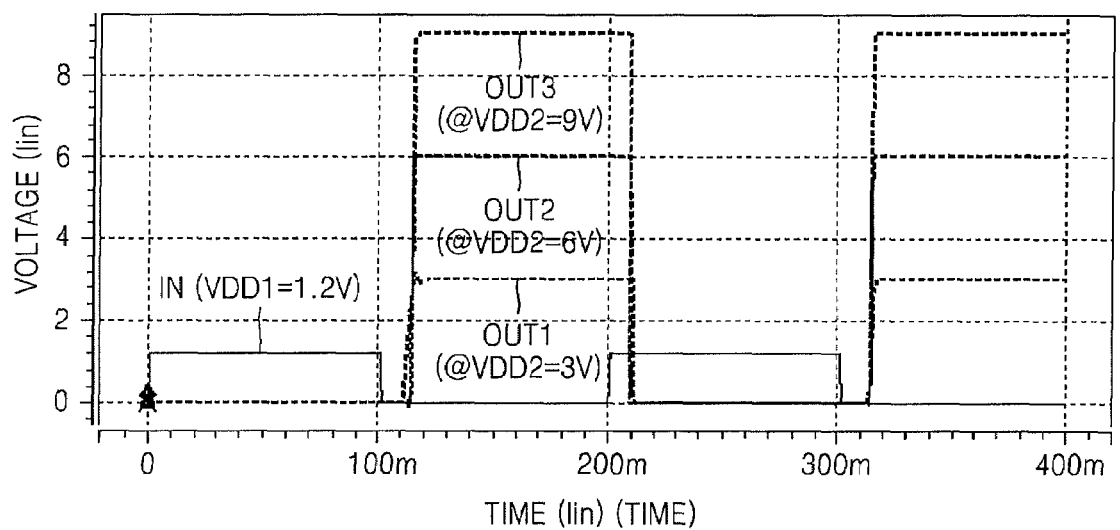
FIGS. 6A and 6B illustrate voltage simulation results of the level shifter of FIG. 3 according to the present invention.
Figure 6B:
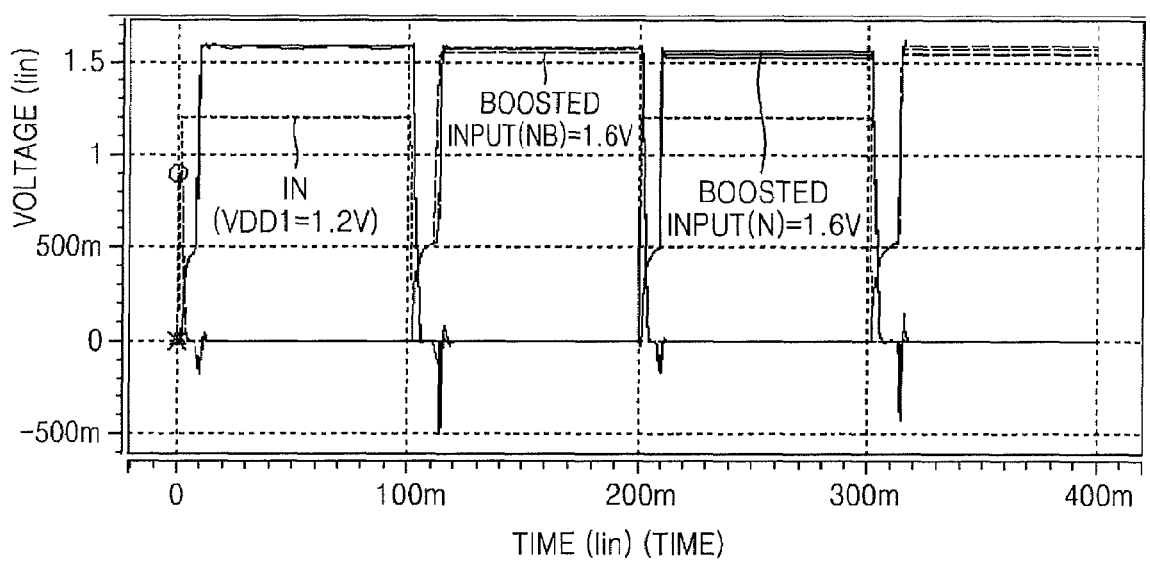

FIGS. 6A and 6B illustrate voltage simulation results of the level shifter of FIG. 3 according to an embodiment the present invention.

In FIGS. 6A and 6B, IN denotes an input signal; OUT1 denotes an output signal when a source voltage VDD1 is 1.2V and a source voltage VDD2 is 3V; OUT2 denotes an output signal when the source voltage VDD1 is 1.2V and the source voltage VDD2 is 6V; and OUT3 denotes an output signal when the source voltage VDD1 is 1.2V and the source voltage VDD2 is 9V. BOOSTED INPUT (N) denotes a level of an input terminal N connected to a level shifting circuit 31; and BOOSTED INPUT (NB) denotes a level of a complementary input terminal NB connected to the level shifting circuit 31.

Referring to FIG. 6A, in a level shifter according to an embodiment of the present invention, a level of the output signal OUT is shifted to 9V even when the source voltage VDD1 is as low as 1.2V.

Figure 7A:
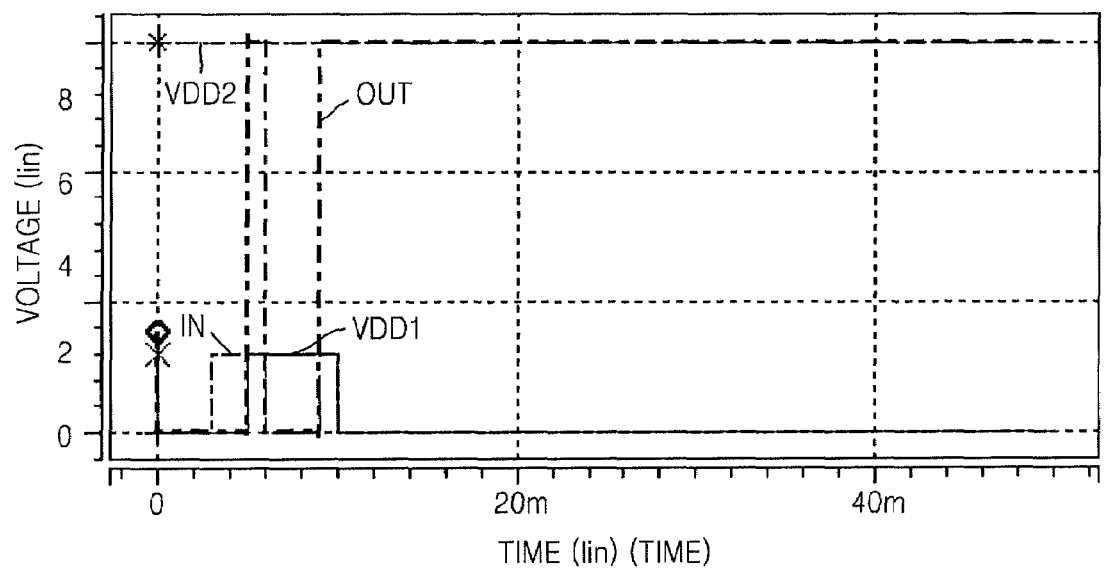
FIG. 7A illustrates a voltage simulation result of the level shifter of FIG. 3 according to the present invention in a deep standby mode.
Figure 7B:
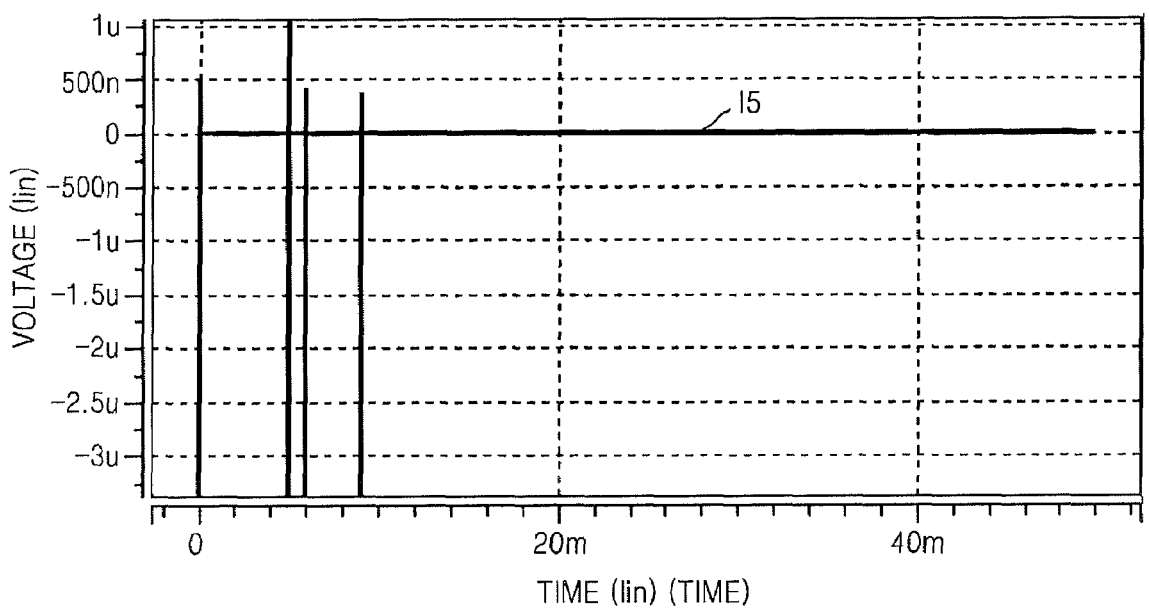
FIG. 7B illustrates a current simulation result of the level shifter of FIG. 3 according to the present invention in a deep standby mode.

FIG. 7A illustrates a voltage simulation result of the level shifter of FIG. 3 according to an embodiment of the present invention in a deep standby mode and FIG. 7B illustrates a current simulation result of the level shifter of FIG. 3 according to an embodiment of the present invention in a deep standby mode.

In FIG. 7A, IN and OUT denote input and output signals, respectively, when the source voltage VDD1 is 1.2V and the source voltage VDD2 is 6V, respectively. In FIG. 7B, I5 denotes an operating current when the source voltage VDD1 is 1.2V and the source voltage VDD2 is 6V.

Referring to FIGS. 7A and 7B, in a level shifter according to an embodiment of the present invention, a leakage current is not generated even when a level of the source voltage VDD1 is the same as a level of the ground voltage VSS in a deep standby mode.

In a level shifter according to an embodiment of the present invention, as described above, a level of an output signal can be shifted to a high level even when a supplied source voltage is low. Further a leakage current is not generated even when a semiconductor integrated circuit is in a deep standby mode.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An input voltage boosting level shifter comprising:
   a level shifting circuit shifting a level of a boosted signal input through an input terminal connected to the level shifter and outputting the boosted signal at a new level; and
   a boosting circuit receiving an input signal, boosting a voltage of the input signal to generate the boosted signal, and providing the boosted signal to the input terminal, wherein the boosting circuit comprises:
   a first inverter which reverses the input signal;
   a second inverter which reverses an output signal of the first inverter;
   a delay unit which delays an output signal of the second inverter;
   a third inverter which reverses an output signal of the delay unit;
   a fourth inverter which reverses an output signal of the third inverter;
   a first capacitor having a first end connected to an output terminal of the fourth inverter and a second end connected to the input terminal;
   a second capacitor having a first end connected to an output terminal of the third inverter and a second end connected to a complementary input terminal of the input terminal connected to the level shifting circuit;
   a first control transistor having a gate connected to an output terminal of the second inverter, a first end connected to the first source voltage, and a second end connected to the input terminal;
   a second control transistor having a gate connected to an output terminal of the first inverter, a first end connected to the input terminal, and a second end connected to a reference voltage;
   a third control transistor having a gate connected to an output terminal of the first inverter, a first end connected to the first source voltage, and a second end connected to the complementary input terminal; and
   a fourth control transistor having a gate connected to an output terminal of the second inverter, a first end connected to the complementary input terminal, and a second end connected to the reference voltage.

2. The input voltage boosting level shifter of claim 1, wherein the level shifting circuit is a latch-type level shifting circuit.

3. The input voltage boosting level shifter of claim 1, wherein the boosting circuit uses a first source voltage as a source voltage and the level shifting circuit uses a second source voltage, which is higher than the first source voltage, as the source voltage.

4. The input voltage boosting level shifter of claim 3, wherein the level shifting circuit comprises:
   a latch circuit;
   a first MOS transistor having a gate connected to the input terminal, a first end of the first MOS transistor connected to a first output terminal of the latch circuit, and a second end of the first MOS transistor connected to the reference voltage; and
   a second MOS transistor having a gate connected to a complementary input terminal of the input terminal, a first end of the second MOS transistor connected to a second output terminal of the latch circuit, and a second end of the second MOS transistor connected to the reference voltage, wherein an output signal is output from the second output terminal of the latch circuit.

5. The input voltage boosting level shifter of claim 4, wherein the first and second MOS transistors are NMOS transistors.

6. The input voltage boosting level shifter of claim 4, wherein the reference voltage is a ground voltage.

7. The input voltage boosting level shifter of claim 1, wherein the first through fourth control transistors are NMOS transistors.

8. An input voltage boosting level shifter comprising: a boosting circuit for receiving an input signal and a first source voltage, boosting the level of the input signal, and outputting a boosted signal; and
- a latch type level shifting circuit receiving the boosted signal and a second source voltage greater than the first source voltage and shifting a level of the boosted signal to a logic high level even when the first source voltage is at a low logic level,
- wherein an operating current of the latch type level shifting circuit does not exhibit a leakage current when the first source voltage has a voltage of a ground voltage,
- wherein the boosting circuit comprises:
    - a first inverter which reverses the input signal;
    - a second inverter which reverses an output signal of the first inverter;
    - a delay unit which delays an output signal of the second inverter;
    - a third inverter which reverses an output signal of the delay unit;
    - a fourth inverter which reverses an output signal of the third inverter;
    - a first capacitor having a first end connected to an output terminal of the fourth inverter and a second end connected to the input terminal of the latch type level shifting circuit;
    - a second capacitor having a first end connected to an output terminal of the third inverter and a second end connected to a complementary input terminal of the input terminal connected to the level shifting circuit;
    - a first control transistor having a gate connected to an output terminal of the second inverter, a first end connected to the first source voltage, and a second end connected to the input terminal;
    - a second control transistor having a gate connected to an output terminal of the first inverter, a first end connected to the input terminal, and a second end connected to a reference voltage;
    - a third control transistor having a gate connected to an output terminal of the first inverter, a first end connected to the first source voltage, and a second end connected to the complementary input terminal; and
    - a fourth control transistor having a gate connected to an output terminal of the second inverter, a first end connected to the complementary input terminal, and a second end connected to the reference voltage.

* * * * *